United States Patent
Arena

(10) Patent No.: US 9,070,818 B2
(45) Date of Patent: Jun. 30, 2015

(54) METHODS AND STRUCTURES FOR BONDING ELEMENTS

(75) Inventor: Chantal Arena, Mesa, AZ (US)

(73) Assignee: SOITEC, Bernin (FR)

( * ) Notice: Subject to any disclaimer, the term of this patent is extended or adjusted under 35 U.S.C. 154(b) by 234 days.

(21) Appl. No.: 12/820,326

(22) Filed: Jun. 22, 2010

(65) Prior Publication Data

US 2011/0011450 A1    Jan. 20, 2011

Related U.S. Application Data

(60) Provisional application No. 61/226,353, filed on Jul. 17, 2009.

(51) Int. Cl.
*H01L 31/18* (2006.01)
*C23C 14/08* (2006.01)
*H01L 33/00* (2010.01)

(52) U.S. Cl.
CPC .............. *H01L 31/18* (2013.01); *C23C 14/086* (2013.01); *H01L 31/1884* (2013.01); *H01L 31/1892* (2013.01); *H01L 33/0079* (2013.01); *Y02E 10/50* (2013.01)

(58) Field of Classification Search
CPC ............ H01L 31/1884; H01L 33/0079; C23C 14/086
USPC .................................... 136/255, 256; 438/107
See application file for complete search history.

(56) References Cited

U.S. PATENT DOCUMENTS

| | | | |
|---|---|---|---|
| 5,231,045 A | 7/1993 | Miura et al. | |
| 6,114,188 A | 9/2000 | Oliver et al. | |
| 6,493,497 B1 | 12/2002 | Ramdani et al. | |
| 6,559,075 B1 | 5/2003 | Kelly et al. | |
| 2003/0172967 A1* | 9/2003 | Tachibana et al. | 136/244 |
| 2005/0161078 A1 | 7/2005 | Aiken | |
| 2006/0162768 A1 | 7/2006 | Wanlass et al. | |
| 2006/0260675 A1* | 11/2006 | Sugawara et al. | 136/252 |
| 2007/0010035 A1 | 1/2007 | Liu et al. | |
| 2007/0119812 A1* | 5/2007 | Kerdiles et al. | 216/34 |
| 2007/0131275 A1 | 6/2007 | Kinsey et al. | |
| 2007/0134419 A1 | 6/2007 | Mitrovic et al. | |
| 2007/0277873 A1 | 12/2007 | Cornfeld et al. | |
| 2008/0142810 A1 | 6/2008 | Tompa et al. | |
| 2010/0083999 A1* | 4/2010 | Hovel | 136/244 |
| 2011/0017298 A1* | 1/2011 | Lee | 136/261 |

FOREIGN PATENT DOCUMENTS

| | | |
|---|---|---|
| CN | 1543580 A | 11/2004 |
| EP | 0193830 A2 | 9/1986 |
| EP | 2192619 A1 | 6/2010 |

(Continued)

OTHER PUBLICATIONS

JP2001-244488 A, Machine Translation, Kondo, Sep. 2001.*

(Continued)

*Primary Examiner* — Devina Pillay
(74) *Attorney, Agent, or Firm* — TraskBritt

(57) ABSTRACT

Embodiments of the invention relate to methods and structures for fabricating semiconductor structures that include at least one bonding layer for attaching two or more elements to one another. The at least one bonding layer may be at least substantially comprised of zinc, silicon and oxygen.

19 Claims, 3 Drawing Sheets

(56) References Cited

FOREIGN PATENT DOCUMENTS

| JP | 07-230716 | * | 8/1995 | ............... H01B 5/14 |
| JP | 2001-244488 | * | 9/2001 | .............. H01L 31/04 |
| WO | 99/52155 A1 | | 10/1999 | |
| WO | 2009038083 A1 | | 3/2009 | |

OTHER PUBLICATIONS

JP07-230716, Tsutao, Machine Translation, Aug. 1995.*
Christiansen, Silke H., et al., Wafer Direct Bonding: From Advanced Substrate Engineering to Future Applications in Micro/Nanoelectronics, Proceedings of the IEEE 2006, pp. 2060-2106, vol. 94, No. 12.
Yan, J., et al., Fabrication and characterization of photoluminescent Mn-doped-Zn(2)SiO(4) films deposited on silicon by pulsed laser deposition, Thin Solid Films, 2006, pp. 1877-1880, vol. 515, Elsevier.
Sharps, P.R., et al., Wafer Bonding for Use in Mechanically Stacked Multi-Bandgap Cells, 26th PVSC, Sep. 30-Oct. 3, 1997, Anaheim, CA, pp. 895-898, IEEE.
Knechtel, R., et al., "Wafer level encapsulation of microsystems using glass frit bonding," Microsyst. Technol. (2006) 12: 468-472.
Minami, T., et al., "Highly Conductive and Transparent Silicon Doped Zinc Oxide Thin Films Prepared by RF Magnetron Sputtering," Japanese Journal of Applied Physics, vol. 25, No. 9, Sep. 1986, pp. L776-L779.
Tong, Q.-Y., et al., "Semiconductor wafer bonding: recent developments," Materials Chemistry and Physics, 37 (1994) 101-127.
International Search Report, International Application No. PCT/US2010/039416, mailed Sep. 28, 2010, five (5) pages.
Written Opinion of the International Searching Authority, International Application No. PCT/US2010/039416, mailed Sep. 28, 2010, five (5) pages.
International Preliminary Report on Patentability for International Application No. PCT/US2010/039416 dated Jan. 17, 2012, 7 pages.
Chinese Search Report for Chinese Application No. 2010800311458 dated Mar. 22, 2014, 2 pages.

* cited by examiner

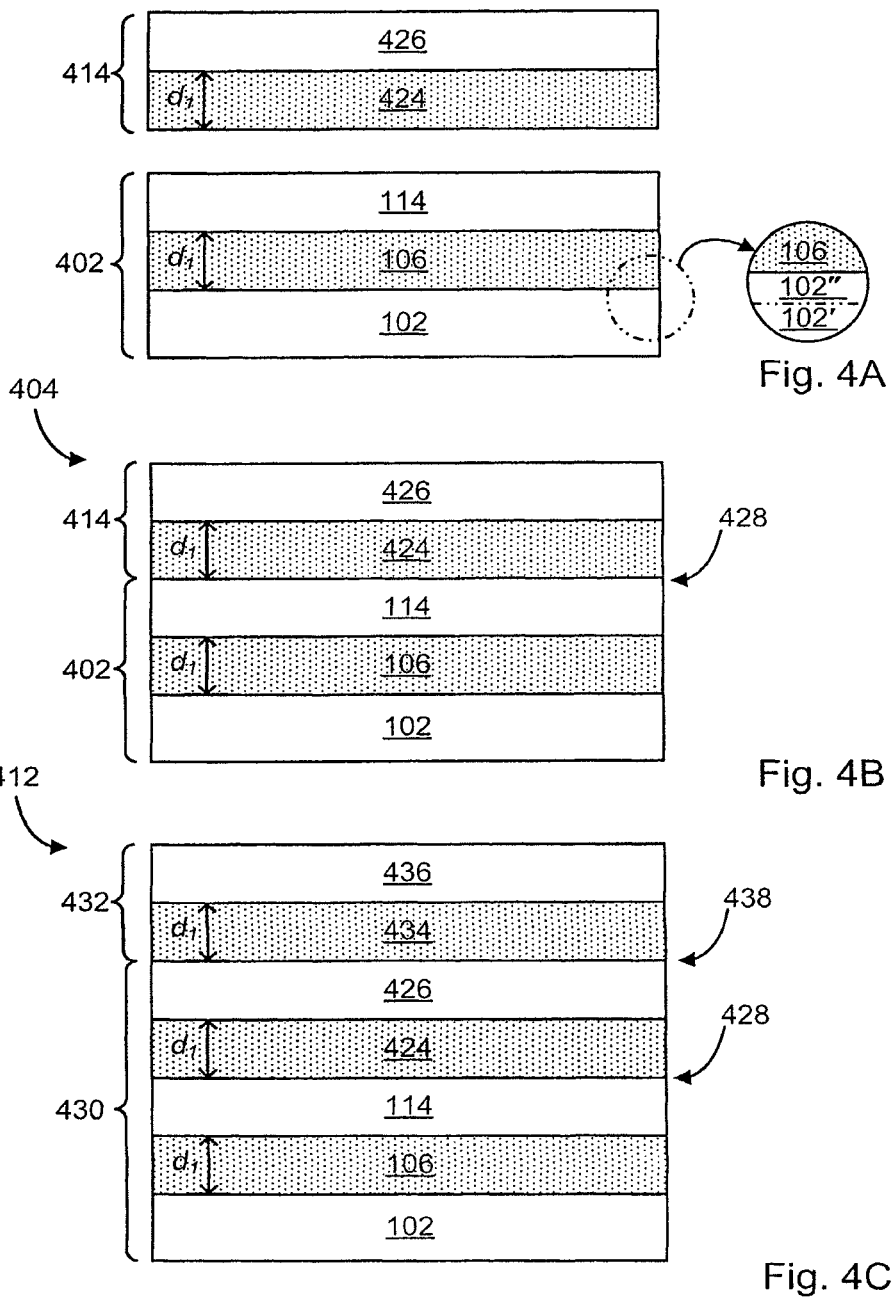

METHODS AND STRUCTURES FOR BONDING ELEMENTS

CROSS-REFERENCE TO RELATED APPLICATION

This application is a utility conversion of U.S. Provisional Patent Application Ser. No. 61/226,353, filed Jul. 17, 2009, the entire disclosure of which is hereby incorporated herein by this reference.

TECHNICAL FIELD

The various embodiments of the present invention generally relate to methods and structures for fabricating semiconductor structures, and more particularly, to methods and structures for forming bonding layers for attaching two or more elements to one another during fabrication of semiconductor structures.

BACKGROUND

Numerous semiconductor structures are produced by the attachment of two or more elements to one another to produce a desired structure. Such attachment methods may be utilized when the elements comprising the desired structure may not be readily fabricated by conventional means such as, for example, direct growth or deposition.

The attachment of two or more elements is commonly performed utilizing bonding techniques. Such bonding techniques encompass a number of methods commonly referred to as, for example, molecular, fusion, metallic, adhesive, solder and direct bonding. For example, see the journal publications of Tong et al., *Materials, Chemistry and Physics* 37:101 (1994), entitled "Semiconductor Wafer Bonding: Recent Developments," and Christiansen et al., Proceedings of the IEEE 94 12 2060, 2006, entitled "Wafer Direct Bonding: From Advanced Substrate Engineering to Future Applications in Micro/Nanoelectronics."

The bonding of elements to one another is commonly assisted by the formation of a bonding layer on a surface of at least one of the elements. The surface chemistry of the bonding layer can improve the adhesion of the two elements to one another, such that the two elements can be attached with sufficient bonding energy to enable further processing to be performed on the bonded semiconductor structure without unwanted premature separation.

Bonding layers may encompass a multitude of materials including, for example, conductors (e.g., metals), semiconductors and insulators. One of the more common bonding layers comprises a silicate such as, for example, silicon dioxide, wherein the surface chemistry of the silicon dioxide surface may comprise silanol (Si—OH) groups capable of producing high bonding energies. However, the use of insulating bonding layers may prevent the flow of electrons between the bonded elements, which may impede or prevent electrical conductivity between the two or more elements.

The flow of electrons and, hence, electrical current between two bonding elements can be realized by utilizing metallic bonding layers. Metallic bonding layers have been produced using a number of different metallic materials such as, for example, copper and gold. However, the use of metallic bonding layers can severely limit the transmission of light through the bonded structure since metallic bonding layers may substantially prevent light transmission when the metallic layers are above a certain thickness. Therefore, metallic bonding layers may not be suitable or ideal bonding materials when bonding elements through which light may be transmitted during use, such as those used in optical, optoelectronic or photovoltaic structures.

SUMMARY OF THE INVENTION

The various embodiments of the present invention generally provide methods and structures for the fabrication of semiconductor structures comprising providing a bonding layer at least substantially comprised of zinc, silicon and oxygen on a surface of at least one of a first element and a second element. In certain embodiments of the invention, the methods also comprise disposing the bonding layer between the first element and the second element and attaching the first element and the second element to one another at a bonding interface using the bonding layer disposed between the first element and the second element.

The various embodiments of the invention also include semiconductor structures formed by the methods previously outlined. Therefore, the embodiments of the invention also include a semiconductor structure comprising a first element and a second element and at least one bonding layer disposed between and bonding together the first element and the second element, the at least one bonding layer at least substantially comprised of zinc, silicon and oxygen.

Further aspects and details and alternative combinations of the elements of this invention will be apparent from the following detailed description and are also within the scope of the inventor's invention.

BRIEF DESCRIPTION OF THE DRAWINGS

The present invention may be understood more fully by reference to the following detailed description of example embodiments of the present invention, which are illustrated in the appended figures in which:

FIGS. 4A-4C schematically illustrate yet further embodiments of the invention for use in bonding a number of elements to one another utilizing a number of bonding layers.

DETAILED DESCRIPTION OF THE INVENTION

The illustrations presented herein are not meant to be actual views of any particular material, apparatus, system, or method, but are merely idealized representations that are employed to describe the present invention.

Headings are used herein for clarity only and without any intended limitation. A number of references are cited herein, and the disclosures of which are hereby incorporated herein, in their entirety, by this reference for all purposes. Further, none of the cited references, regardless of how characterized above, is admitted as prior art relative to the invention of the subject matter claimed herein.

Figure 1A:
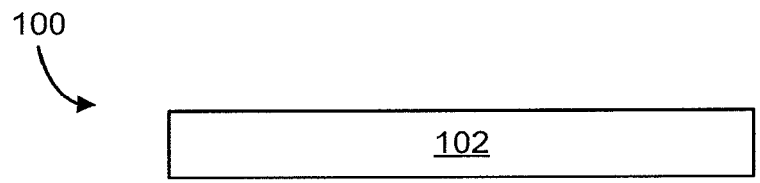
FIGS. 1A-1D schematically illustrate embodiments of the invention for use in bonding a number of elements to one another utilizing a bonding layer.

An example embodiment of the invention is described below with reference to FIGS. 1A-1D. FIG. 1A illustrates a semiconductor structure 100 that comprises a first element 102. The first element 102 may comprise a multitude of structures and materials. For example, the first element 102 may comprise at least one of a layer structure, a device structure and a bonded structure (e.g., a structure that includes two or more layers, devices, or layers and devices bonded to one another).

In more detail, a layer structure may comprise an at least substantially homogeneous layer of a single material. Some such layer structures include what are referred to in the art as free-standing substrates (FS-substrates). The homogeneous material may comprise, for example, elemental or compound materials, and may be conducting (e.g., metallic), semiconducting, or insulating. In some embodiments, the homogeneous material may comprise one or more of silicon, germanium, silicon carbide, group III-arsenides, group III-phosphides, group III-nitrides, group III-antimonides, groups II-VI compounds, metals, metallic alloys, sapphire, quartz and zinc oxide.

In additional embodiments, the first element 102 may comprise a layer structure including a heterogeneous structure comprising two or more materials. Such a heterogeneous structure may include a template structure (such as, for example, a semiconductor layer) upon a base substrate. In such embodiments, the template structure and base substrate may comprise materials as mentioned previously. Further, the layer structure may include two or more materials grown, deposited or placed on top of one another to form a layer stack. Again, such a structure may include materials previously mentioned.

In further embodiments of the invention, the first element 102 may comprise a device structure. The device structure may comprise active components, passive components and mixtures thereof. The device structure may comprise, for example, switching structures (e.g., transistors, etc.), light-emitting structures (e.g., laser diodes, light-emitting diodes, etc.), light receiving structures (e.g., waveguides, splitters, mixers, photodiodes, solar cells, solar subcells etc.), microelectromechanical system structures (e.g., accelerometers, pressure sensors, etc). It should be noted that a device structure (i.e., a first element for bonding) may comprise a non-functioning component part that, when bonded to one or more further elements, produces the functional device structure. It should also be noted that the materials comprising the device structure may comprise those previously mentioned above.

In yet further embodiments of the invention, the first element 102 may comprise a bonded structure in which two or more elements are attached and bonded together utilizing known methods and/or methods of the invention as described herein. Such bonded structures are discussed in further detail herein below.

Figure 1B:
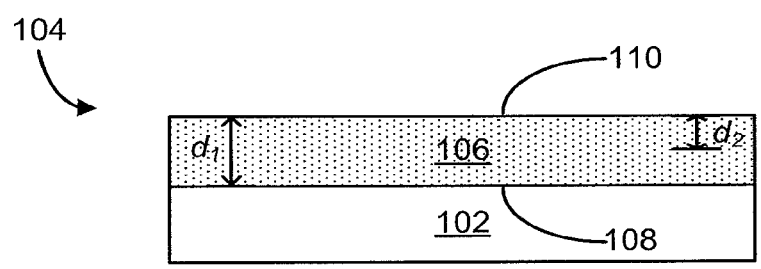

FIG. 1B illustrates a semiconductor structure 104 that comprises first element 102 and bonding layer 106. Bonding layer 106 may be formed adjacent to surface 108 of first element 102. The bonding layer 106 may comprise zinc, silicon and oxygen. In some embodiments, the bonding layer 106 may consist essentially of zinc, silicon and oxygen. In some embodiments, the bonding layer 106 may comprise the compound ZnSiO, wherein the stoichiometry of the ZnSiO compound is in no way limited.

In some embodiments of the invention, bonding layer 106 has a thickness $d_1$ (as illustrated in FIG. 1B) of greater than about 10 nm, or in further embodiments greater than 150 nm, or in yet further embodiments greater than 1000 nm. The composition of the ZnSiO bonding layer 106 may be at least substantially constant throughout the majority of the total thickness $d_1$, or the composition may vary throughout the thickness $d_1$ depending on the desired properties of the bonding layer 106. For example, bonding layer 106 may have a composition within a thickness $d_2$ adjacent to surface 110, and the composition of the bonding layer 106 outside the thickness $d_2$ may be the same as, or different from, the composition of the bonding layer 106 within the thickness $d_2$. In addition, bonding surface 110 of bonding layer 106 can be treated or formed in such a manner that the surface chemistry of bonding surface 110 can assist in attachment of the bonding layer 106 to further elements.

Bonding layer 106 may be formed on surface 108 of first element 102 by a multitude of methods including chemical vapor deposition (CVD) (e.g., metallorganic chemical vapor deposition (MOCVD) or molecular beam epitaxy (MBE)), physical vapor deposition (PVD) (e.g., pulsed laser deposition (PLD), electron-beam evaporation, or sputtering). For example, both Veeco Instruments Inc. (Plainview, N.Y.), and Structured Materials Industries, Inc. (Piscataway, N.J.) produce CVD reactors for the deposition of ZnSiO. See, for example, U.S. patent application Ser. No. 11/544,075, which was filed Oct. 6, 2006 by Mitrovic et al. (U.S. Patent Application Publication No. 2007/0134419 A1, published Jun. 14, 2007), and U.S. patent application Ser. No. 11/973,766, which was filed Oct. 10, 2007 by Tompa et al. (U.S. patent application Publication No. 2008/0142810 A1, published June 19, 2008).

Bonding layer 106 may be formed by placing first element 102 in a CVD reactor (e.g., an MOCVD reactor). Diethyizinc $(C_2H_5)_2Zn$ may be used as a precursor for the zinc component of bonding layer 106, silane may be used as a precursor for the silicon component of bonding layer 106, and an oxidizing gas such as, for example, oxygen may be used as a precursor for the oxygen component of bonding layer 106. The reactor temperature may be maintained at a temperature between about 400° C. and about 700° C., and the chamber pressure may be maintained between about 5 torr and about 25 torr.

ZnSiO can also be formed utilizing pulsed laser deposition (PLD). For example, first element 102 may be loaded into a vacuum chamber, and a laser may be used to ablate material from a zinc silicate ceramic target. The ablated material may be deposited on surface 108 of element 102 as ZnSiO. For example, see journal publication Yan et al., *Thin Solid Films* 515:1877 (2006), entitled "Fabrication and Characterization of Photoluminescent Mn-doped-$Zn_2SiO_4$ Films Deposited on Silicon by Pulsed Laser Deposition."

In addition to controlling the composition of the bonding layer 106, the conductivity of the bonding layer 106 may be managed through intentional atomic doping (e.g., doping with atoms). A number of dopants are known in the art to produce intentional doping in ZnO based and ZnSiO type materials. For example, n-type doping has been observed through the introduction of dopants such as Al, Ga, In, N, P, and Sb, utilizing precursors such as trimethylaluminum, trimethylgallium, trimethylindium, etc. In further embodiments, the ZnSiO based bonding layer 106 may be conductive without the introduction of atomic dopants. For example, conductivity within ZnSiO may result from native defects in the crystal lattice of the ZnSiO material such as, for example, atomic vacancies in the crystal lattice or the presence of atoms in interstitial spaces within the crystal lattice.

Figure 1C:
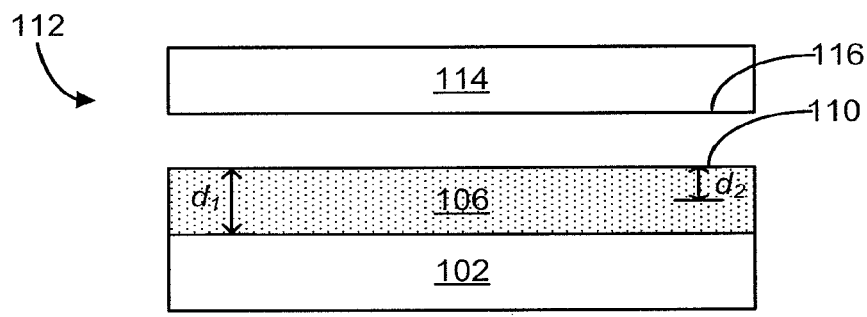

FIG. 1C illustrates a semiconductor structure 112 that comprises first element 102, bonding layer 106 and a second element 114. Second element 114 may comprise all the structures, devices and materials previously described in relation to first element 102. In this embodiment of the invention, surface 116 of second element 114 may be bonded (see FIG. 1D) to bonding surface 110 of bonding layer 106. To facilitate adequate bonding between surface 116 of second element 114 and bonding surface 110 of bonding layer 106, surface 116 of second element 114 may be clean and may have a surface root mean square (rms) roughness of less than about 1 nm. In addition, the surface 116 of second element 114 may be treated or formed in such a way that the surface chemistry of surface 116 promotes molecular adhesion with a contacting bonding surface of bonding layer 106.

Figure 1D:
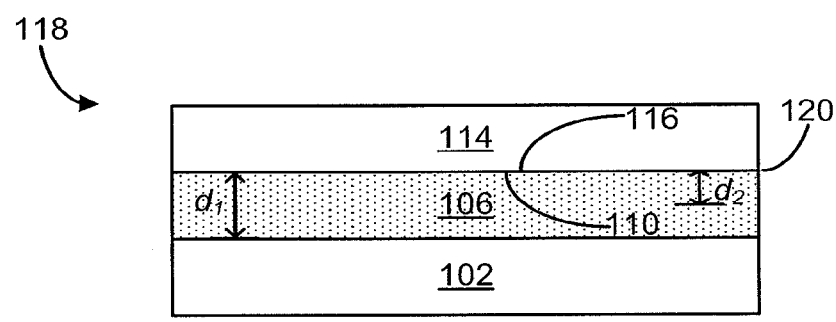

FIG. 1D illustrates a semiconductor structure 118 that comprises first element 102 and second element 114. In semiconductor structure 118, second element 114 is bonded to first element 102 through bonding layer 106, which is disposed between the first element 102 and the second element 114. The bonding of first element 102 to second element 114 through bonding layer 106 produces bonding interface 120, wherein bonding interface 120 is the interface between the bonding surface 110 of bonding layer 106 and the surface 116 of second element 114.

The bonding of first element 102 to second element 114 through bonding layer 106 can be produced by molecular adhesion (i.e., bonding without the use of a glue, wax, solder, etc.). For example, bonding operations may require that bonding surface 110 and surface 116 be sufficiently smooth and free of particles and contamination, and that the surfaces 110, 116 be sufficiently close to one another to allow contact therebetween to be initiated (commonly at a distance of less than 5 nm). When brought into such proximity, the forces of attraction between bonding surface 110 and surface 116 can be sufficiently high to cause molecular adhesion (bonding induced by all of the forces of attraction (e.g., Van der Waals forces) resulting from the electronic interactions between the atoms or the molecules of the two surfaces 110, 116 to be bonded).

The initiation of the molecular adhesion can commonly be achieved by application of localized pressure, for example, using a TEFLON® stylus on an element in close contact with another element in order to trigger propagation of a bonding wave from the point of initiation. The term "bonding wave" refers to the front of the bonds or the molecular adhesion spreading from the point of initiation and corresponding to the dissemination of the forces of attraction from the point of initiation over the entire surface of close contact between the bonding layer 106 and the second element 114 at the bonding interface 120.

In some embodiments of the invention, the composition of bonding layer 106 adjacent to bonding interface 120 may be at least substantially comprised of silicon and oxygen. More particularly, the composition of bonding layer 106 adjacent to bonding interface 120 may consist essentially of silicon and oxygen. For example, the composition of bonding layer 106 may consist essentially of a silicon oxide within a distance $d_2$ adjacent to bonding surface 110 and adjacent to bonding interface 120. When stating that a portion of the bonding layer 106 may consist essentially of a silicon oxide, this is by no means limiting the stoichiometry of the silicon oxide material adjacent to bonding surface 110, for example, the silicon oxide material can include SiO, $SiO_2$ or more generally $SiO_x$. The distance $d_2$ adjacent to bonding surface 110 in which the bonding layer 106 may be substantially comprised of a silicon oxide may have a thickness of about 0.5 nm or less, or in further embodiments, about 1 nm or less, or in yet further embodiments, about 5 nm or less. The distance $d_2$ of the thickness of the bonding layer 106 substantially comprised of a silicon oxide may be minimized in order to substantially preserve the electrical conductivity of bonding layer 106.

The composition of the bonding layer 106 adjacent to bonding interface 120 can be controlled by utilizing a number of methods. For example, the composition of the ZnSiO formed by CVD can be varied by altering the deposition parameters of the reactor, such parameters including temperature, pressure and precursor flow rates. For example, the percentage content of silicon in bonding layer 106 may be increased by increasing the flow rate of the silicon precursor and vice versa, whereas the percentage content of zinc in bonding layer 106 may be decreased by decreasing the flow rate of the zinc precursor and vice versa. In other embodiments of the invention in which the ZnSiO layer is formed by PLD, variation in the composition of the ZnSiO may be achieved by utilizing multiple target materials of varying composition such as, for example, using ZnSiO, $ZnO_x$ and $SiO_x$ targets.

In addition to controlling the composition of the bonding layer 106 adjacent to the bonding interface 120, the surface chemistry of bonding surface 110 of the bonding layer 106 may also be controlled to produce efficient attachment. Bonding surface 110 of bonding layer 106 may be formed in such a way, or the bonding surface 110 may be treated after formation of the bonding layer 106 in such a way that the bonding surface 110 comprises a surface suitable for promoting molecular adhesion to the surface 116 of the second element 114. For example, bonding surface 110 of bonding layer 106 may comprise a plurality of hydroxyl groups (—OH) (e.g., silanol groups (Si—OH)), which may promote molecular adhesion. In addition, bonding surface 110 should be free of surface contaminants and have a surface roughness of less than approximately 5 nm, to ensure sufficient bond strength with a second element 114.

Upon bonding of first element 102 to second element 114 through bonding layer 106, further post bonding treatments may be performed. For example, semiconductor structure 118 may be annealed at a temperature of between 100° C.-1500° C. to increase the bond strength between the first element 102, the bonding layer 106, and the second element 114. Increasing the bond strength of semiconductor structure 118 may be performed to reduce the probability of unwanted separation of semiconductor structure 118, such as might occur during possible further processing.

The bonding of first element 102 to second element 114 through bonding layer 106 may produce an optical and electrical coupling between the first element 102 and the second element 114. In embodiments of the invention, bonding layer 106 may be electrically conductive and transparent to light thereby providing a path for electrical current and optical photons between the first element 102 and the second element 114. Therefore, semiconductor structure 118 may comprise at least one bonding layer with sufficient electrical conductivity to allow the flow of an electrical current. In addition, semiconductor structure 118 may comprise at least one bonding layer with an electrical resistivity sufficiently low to allow the flow of an electrical current. Semiconductor structure 118 may also comprise at least one bonding layer with sufficient optical transparency to allow light of desired energies to be transmitted through the bonding layer 106, for example, in certain embodiments, bonding layer 106 may be transparent to light of energies between 0.4 eV to 4.0 eV; however, in other embodiments of the invention the bonding layer 106 may be transparent to electromagnetic energies of a greater range.

Figure 2A:
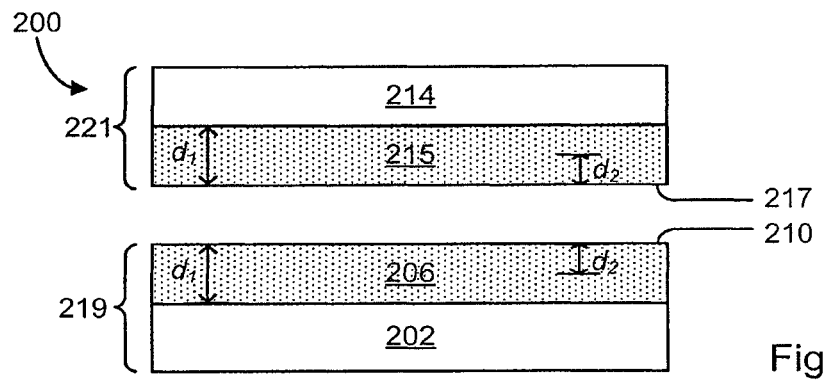
FIGS. 2A and 2B schematically illustrate further embodiments of the invention for use in bonding a number of elements to one another utilizing two or more bonding layers.
Figure 2B:
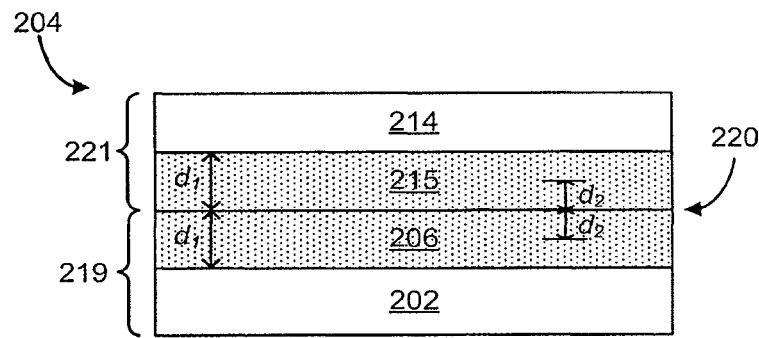

Further embodiments of the invention are described below with reference to FIGS. 2A and 2B. The embodiments illustrated in FIGS. 2A and 2B are similar to those previously outlined in FIGS. 1A-1D. However, in these further embodiments, a bonding layer is formed on a surface of each of the elements, i.e., on a surface of both the first element and the second element, such that a bonding interface is formed that is disposed between the two bonding layers.

In greater detail, FIG. 2A illustrates semiconductor structure 200 that comprises first element 202, bonding layer 206, second element 214 and bonding layer 215. First element 202 and second element 214 may comprise any of the structures, devices, and materials previously described in relation to the elements 102, 114 of FIGS. 1A-1D. In addition, bonding layers 206 and 215 and bonding surfaces 210 and 217 may comprise any of the properties previously described in relation to the bonding layer 106 and bonding surface 110 of FIGS. 1A-1D. The bonding layer 206 may be formed on first element 202 to form structure 219, and the bonding layer 215 may be formed on second element 214 to form structure 221.

FIG. 2B illustrates semiconductor structure 204 that comprises first element 202, bonding layer 206, second element 214 and bonding layer 215, wherein structures 219 and 221 are bonded together through bonding layers 206 and 215, producing bonding interface 220 disposed between the first element 202 and second element 214 and, more particularly, between the bonding layer 206 and the bonding layer 215. The methods for bonding structures 219 and 221 may comprise any of the methods previously described for bonding the elements 102, 114 of FIGS. 1A-1D. Attachment of elements 202 and 214 utilizing a bonding layer on each of the elements 202 and 214 may assist in producing bond interface 220 with a desired bond strength for subsequent processing.

Figure 3A:
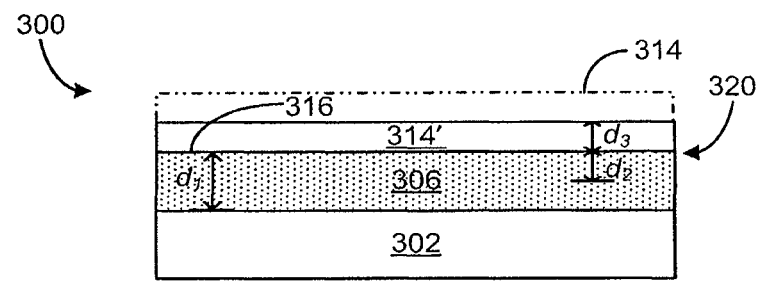
FIGS. 3A and 3B schematically illustrate embodiments of the invention for use in bonding a number of elements to one another utilizing a bonding layer in which one or more elements is thinned, and a further layer structure is formed on the one or more thinned elements.
Figure 3B:
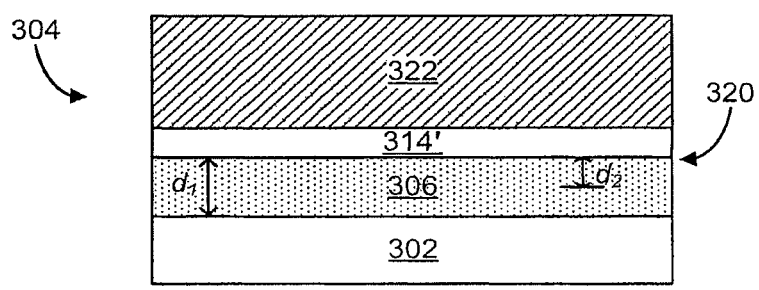

Further embodiments of the invention are described with reference to FIGS. 3A and 3B. The embodiments illustrated in FIGS. 3A and 3B are similar to those described with reference to FIGS. 1A-1D. In these further embodiments of the invention, at least one of the elements may be thinned and utilized for subsequent formation of a further layer structure.

The embodiments of the invention described with reference to FIGS. 3A and 3B begin with semiconductor structure 118 of FIG. 1D (or, alternatively, semiconductor structure 204 of FIG. 2B could be used in an identical manner). First element 302 and second element 314 (phantom region shown in FIG. 3A) may comprise all the structures, devices, and materials previously described in relation to the elements 102, 114 of FIGS. 1A-1D. In certain embodiments of the invention, second element 314 may comprise a crystalline material such as, for example, a semiconductor material such as any of those previously mentioned herein.

FIG. 3A illustrates semiconductor structure 300 that comprises first element 302, bonding layer 306 and thinned second element 314'. The phantom region of second element 314 represents the original thickness of second element 314 prior to a thinning process used to thin the second element 314 to form thinned second element 314'. The remaining thinned second element 314' may remain attached to bonding layer 306 through bonding interface 320 after the thinning process.

The thinning of second element 314 to leave thinned second element 314' may be performed utilizing any of a multitude of thinning methods known in the art. For example, prior to bonding second element 314 to the first element 302 using the bonding layer 306, an ion implantation process may be performed through surface 316 of second element 314 to produce a zone of weakness within the second element 314, the zone of weakness being oriented substantially parallel to surface 316. Upon bonding, energy may be introduced to semiconductor structure 300. For example, any of chemical, mechanical, and thermal energies (including combinations thereof) may be introduced to semiconductor structure 300 during the bonding process. This energy may result in cleavage within the second element 314 at the zone of weakness leaving a portion of second element 314 (i.e., thinned element 314') bonded to first element 302 by bonding layer 306. In further embodiments of the invention, the thinning of second element 314 to produce thinned element 314' may be performed by etching methods, polishing methods, laser lift-off methods, grinding methods, or combinations of such methods. For example, chemical-mechanical polishing (CMP) processes may be used to provide the thinned element 314'. In certain embodiments of the invention, laser lift-off may be utilized to thin second element 314. For example, the second element 314 may comprise a heterogeneous structure comprising two or more materials wherein the laser emission may be absorbed in one layer of the heterogeneous structure releasing thinned element 314' from the remaining portion of second element 314. See, for example, U.S. Pat. No. 6,559,075, issued May 6, 2003 to Kelly et al. Thinned element 314' may have a thickness of $d_3$. In some embodiments, the thickness $d_3$ may be less than about 100 μm. More particularly, the thickness $d_3$ of the thinned element 314' may be less than about 50 μm, or even less than about 20 μm.

FIG. 3B illustrates semiconductor structure 304 that comprises first element 302, bonding layer 306, thinned element 314' and further layer structure 322. In some embodiments of the invention, further layer structure 322 may comprise further device structures, bonded structures and/or layer structures. For example, further layer structure 322 may comprise further crystalline materials, such as a further semiconductor layer structure with a crystal lattice structure substantially matched to that of thinned element 314'. The further layer structure 322 may comprise one or more semiconductor layers suitable for device formation. For example, further layer structure 322 may comprise a semiconductor layer structure suitable for producing light-emitting diodes, laser diodes, transistors, solar cells, photonic devices, microelectromechanical systems, etc. For example, thinned element 314' may comprise a group III-nitride material such as, for example, gallium nitride (GaN), and further layer structure 322 may comprise a further group III-nitride material such as GaN or indium gallium nitride (InGaN) suitable for producing a device structure.

Additional embodiments of the invention are described below with reference to FIGS. 4A-4C. The embodiments illustrated in FIGS. 4A-4C are similar to those previously described with reference to FIGS. 1A-1D. In the embodiments of FIGS. 4A-4C, however, additional elements are bonded to the semiconductor structure formed utilizing the methods of FIGS. 1A-1C. In other words, one or more of the elements to be bonded in accordance with embodiments of the present invention may comprise a bonded structure.

The embodiments of the invention described with reference to FIGS. 4A-4C begin with semiconductor structure 118 of FIG. 1D (or, alternatively, semiconductor structure 204 of FIG. 2B could be used in an identical manner). FIG. 4A illustrates first element 402 of semiconductor structure 400 comprising a bonded structure, such as, for example, the bonded semiconductor structure 118 (of FIG. 1D). Second element 414 comprises bonding layer 424 disposed on the surface of a further element 426. The further element 426 may comprise a device structure, bonded structure or layer structure, as previously described.

FIG. 4B illustrates semiconductor structure 404 that comprises first element 402 attached and bonded to second element 414 via bonding layer 424 at a bonding interface 428 therebetween. The bonded structure or first element 402 is itself bonded to the second element 414 through bonding layer 424. This process can be repeated multiple times until a desired structure is produced. For example, FIG. 4C illustrates semiconductor structure 412 that comprises a first element 430 (i.e., semiconductor structure 404 of FIG. 4B) attached to a second element 432 (comprising bonding layer 434 and further element 436) via bonding layer 434 at a bonding interface 438.

EXAMPLES

Non-limiting examples are now described to further illustrate embodiments of the invention. It should be understood that, in the following examples, parameters (e.g., materials, structures, etc.) are for illustrative purposes only, and do not limit embodiments of the present invention.

With reference to FIG. 1A, first element 102 comprises a silicon carbide (SiC) substrate. The SiC substrate is placed within a MOCVD reactor chamber and by utilizing diethylzinc as a zinc source, silane as silicon source and oxygen as an oxygen source, a ZnSiO bonding layer 106 (FIG. 1B) is formed on surface 108 of the SiC substrate of first element 102. Bonding layer 106 has a thickness of about 50 nm-500 nm. During growth of the ZnSiO bonding layer 106, the zinc precursor is reduced and the silicon precursor increased such that a thickness $d_2$ of the bonding layer 106 is at least substantially comprised of $SiO_2$ (and may be at least substantially free of zinc).

Second element 114 (FIG. 1C) comprises a layer structure including a group III-nitride material layer structure suitable for producing a laser diode device structure. Such a device structure may include p-type and n-type doping regions, waveguiding layers, cladding layers and quantum well regions. Examples of such structures are known in the art. See, for example, S. Nakamura, et al., "The Blue Laser Diode: The Complete Story," 2000, Springer-Verlag. Upon bonding of second element 114 comprising a laser diode device structure to ZnSiO bonding layer 106, further processing may be preformed to produce a functional device. Such further processing may include back-end-of-line processing including metallization, packaging, etc.

The previous example can similarly be performed utilizing embodiments illustrated with reference to FIGS. 2A and 2B. In these embodiments, a ZnSiO bonding layer 206 can be deposited not only on a surface of a SiC substrate of first element 202, as in the previous example, but also a further ZnSiO bonding layer 215 that can be deposited on a surface of a group III-nitride material layer structure 214, using the same methods as outlined above. Structures 219 and 221 can then be brought together and attached using molecular bonding to produce bonding interface 220, as shown in FIG. 2B.

A further example is illustrated with reference to FIGS. 3A and 3B. In FIG. 3A, first element 302 may comprise a sapphire ($Al_2O_3$) substrate. The sapphire substrate is placed within an MOCVD reactor chamber, and a ZnSiO bonding layer 306 is formed thereon as described above. During growth of bonding layer 306, the flow of zinc precursor into the reactor chamber is reduced, and the flow of silicon precursor is increased, such that a thickness $d_2$ of the bonding layer 306 is at least substantially comprised of $SiO_2$.

Second element 314, as shown in phantom, comprises a gallium nitride substrate. The gallium nitride substrate may comprise a free-standing gallium nitride substrate. Prior to bonding, ion implantation is performed into surface 316 of the free-standing gallium nitride substrate of second element 314 to from a zone of weakness oriented substantially parallel to surface 316 at a depth of about 500 nm into the bulk of the gallium nitride free-standing substrate. The second element 314 comprising the free-standing gallium nitride is subsequently bonded to first element 302, which comprises a sapphire wafer, using bonding layer 306. Upon bonding of elements 302 and 314, a heating process of between 100° C.-1500° C. is applied to semiconductor structure 304 (FIG. 3B) in order to fracture the free-standing gallium nitride substrate along the zone of weakness therein, leaving behind the thinned element 314', which comprises a seed layer of gallium nitride and is bonded to bonding layer 306.

Upon formation of thinned element 314' comprising a thin gallium nitride seed layer, a further layer structure 322 is formed on the thinned element 314' (e.g., a thin gallium nitride seed layer). In this example, the further layer structure 322 comprises a group III-nitride based light-emitting diode. Such a light-emitting diode structure may comprise p-type and n-type doping regions, cladding layers, waveguiding layers and quantum well regions. Examples of such structures are known in the art. See, for example, S. Nakamura, et al., "The Blue Laser Diode: The Complete Story," 2000, Springer-Verlag.

Further layer structure 322 can be additionally further processed to produce a functional device, if necessary, as previously outlined. The light output from the light-emitting diode device can be emitted through ZnSiO bonding layer 306, since the composition of the bonding layer 306 can be controlled to allow the bonding layer 306 to be optically transparent to the light emitted from the light-emitting diode.

A further example is illustrated with reference to FIGS. 4A-4C. In FIG. 4A, a first element 402 comprises a bonded structure. In this example the bonded structure of first element 402 comprises a further first element 102, which includes base substrate 102' with a first photovoltaic subcell 102" formed thereon. The first photovoltaic subcell 102" may be formed on the base substrate 102' by, for example, chemical vapor deposition (CVD) methods. ZnSiO bonding layer 106 is deposited on the first photovoltaic subcell 102" using methods previously outlined. First photovoltaic subcell 102" can comprise one or more layers including materials such as those previously outlined (e.g., group III-arsenides, group III-antimonides, group III-nitrides, group III-phosphides and mixtures thereof (such as, for example, mixed arsenides and phosphides and mixed arsenides and nitrides)). In some embodiments of the invention, the first photovoltaic subcell 102" may comprise n-type and p-type doped layers and may comprise Ge, GaInAs or GaInP.

Element 114 of bonded structure of first element 402 may comprise a second photovoltaic subcell bonded to ZnSiO layer 106. The second photovoltaic subcell can comprise the materials, structures and doping types as previously outlined, and, in some embodiments, may comprise GaAs or GaInP.

Second element 414 to be bonded to bonded structure of first element 402 can also include a further element 426 comprising a third photovoltaic subcell. As previously described, the third photovoltaic subcell may comprise many materials, many structures and doping types. In some embodiments of the invention, the third photovoltaic subcell may comprise materials such as InGaP, AlInP, or InGaN. ZnSiO bonding layer 424 is subsequently deposited on further element 426 to produce second element 414. FIG. 4B illustrates the bonding of first element 402, comprising the bonded structure, with second element 414 to produce semiconductor structure 404. Semiconductor structure 404 comprises a first photovoltaic subcell 102", as part of element 102, a second photovoltaic subcell 114 and a third photovoltaic subcell 426. The formation of multiple subcells forms semiconductor structure 404, which comprises a multijunction photovoltaic solar cell.

In further embodiments, a further subcell (i.e., a fourth subcell 436) can be bonded to multijunction photovoltaic structure 404 via ZnSiO bonding layer 434, to produce a multijunction photovoltaic solar cell comprising four (4) subcells, as shown in FIG. 4C. The fourth subcell may comprise materials, structures and doping types, as previously described. In some embodiments, the fourth subcell may comprise InGaP, AlInP or InGaN. It should be noted that further auxiliary layers may be included within the multijunction photovoltaic solar cell structures. Such auxiliary layers are omitted in the figures for clarity, however, it should be understood that the photovoltaic subcell structures and multijunction photovoltaic solar cells may include further auxiliary layers and structures including, for example, tunnel junctions, anti-reflective coatings, back side reflectors and strain relieving layers. Examples of prior art photovoltaic subcells, multijunction photovoltaic solar cells and auxiliary layers can be found in, for example, U.S. patent application Ser. No. 10/515,243, which was filed May 21, 2002 by Wanlass et al. (U.S. Patent Application Publication No. 2006/0162768 A1, published Jul. 27, 2006), and U.S. patent application Ser. No. 11/445,793, which was filed Jun. 2, 2006 by Cornfeld et al. (U.S. Patent Application Publication No. 2007/0277873 A1, published Dec. 6, 2007).

A further example can be illustrated with reference again to FIGS. 4A-4C. In this example the light receiving photovoltaic subcell elements 102", 114, 426, 436 of the multijunction photovoltaic solar cell structures, as described above, can be substituted with light-emitting elements such as, for example, light-emitting diodes (LEDs), to form a light-emitting structure 404 (or 412). The individual light-emitting elements can be selected to emit at different wavelengths to provide the capability of producing a desired light output color hue. The desired color hue can be provided by mixing of the emission from the separate light-emitting elements and through the choice of materials utilized for the individual light-emitting elements. Optically transparent ZnSiO bonding layers 106, 424 and 434 allow the emissions from the separate light-emitting elements to combine and pass through the structure 404 (or 412).

Embodiments of methods and structures of the present invention may be used to enable attachment of two or more elements utilizing bonding layers that may be both electrically conductive and optically transparent. Such methods and structures allow the transmission of both electrons and photons across a bonding layer, and, thus, may be used to electrically and optically couple two or more bonded elements.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. Such modifications are also intended to fall within the scope of the appended claims. Headings and legends are used herein for clarity and convenience only.

What is claimed is:

1. A method for fabricating a semiconductor structure comprising:
providing a bonding layer at least substantially comprised of zinc, silicon and oxygen on a surface of at least one of a first element and a second element, each of the first element and the second element comprising crystalline semiconductor material, the bonding layer being electrically conductive and transparent to light;
formulating a percentage concentration of silicon in the bonding layer to increase proximate to an exposed surface thereof such that a composition of the bonding layer is at least substantially comprised of silicon oxide within a distance adjacent to the exposed surface thereof, the distance being sufficiently small to at least substantially preserve electrical conductivity of the bonding layer through the silicon oxide;
disposing the bonding layer between the first element and the second element; and
attaching the first element and the second element to one another at a bonding interface using the bonding layer disposed between the first element and the second element such that the first element and the second element are optically and electrically coupled to one another through the bonding layer.

2. The method of claim 1, further comprising selecting each of the first element and the second element to comprise at least one of a device structure, a bonded structure and a layer structure.

3. The method of claim 1, wherein providing the bonding layer on the surface of at least one of a first element and a second element comprises:
forming a first bonding layer on a surface of the first element;
forming a second bonding layer on a surface of the second element; and
bonding the first bonding layer to the second bonding layer.

4. The method of claim 1, wherein attaching the first element and the second element to one another comprises attaching the first element and the second element to one another by molecular adhesion.

5. The method of claim 1, further comprising thinning at least one of the first element and the second element to form a thinned element by at least one of an ionic implantation process, a laser lift-off process, a mechanical thinning process and a chemical thinning process.

6. The method of claim 5, further comprising forming another layer structure on the thinned element.

7. A semiconductor structure, comprising:
a first element and a second element, each of the first element and the second element comprising crystalline semiconductor material, and
at least one bonding layer disposed between and bonding together the first element and the second element, the at least one bonding layer at least substantially comprised of zinc, silicon and oxygen, the at least one bonding layer being electrically conductive and transparent to light, the first element and the second element being optically and electrically coupled to one another through the at least one bonding layer, a percentage concentration of silicon in the at least one bonding layer increasing proximate to a bonding interface between the at least one bonding layer and at least one of the first element and the second element such that a composition of the at least one bonding layer is at least substantially comprised of silicon oxide within a distance adjacent to the bonding interface, the distance being sufficiently small to at least substantially preserve electrical conductivity of the at least one bonding layer through the silicon oxide.

8. The semiconductor structure of claim 7, wherein each of the first element and the second element comprises at least one of a device structure, a bonded structure and a layer structure.

9. The semiconductor structure of claim 8, wherein at least one of the first element and the second element comprises a bonded structure including at least one additional bonding layer at least substantially comprised of zinc, silicon and oxygen.

10. The semiconductor structure of claim 7, wherein at least one of the first element and the second element comprises a semiconductor layer having an average layer thickness of less than about 100 μm.

11. The semiconductor structure of claim 7, wherein at least one of the first element and the second element comprises a photovoltaic subcell or a light-emitting element.

12. The semiconductor structure of claim 7, wherein the semiconductor structure comprises a multijunction photovoltaic solar cell or a light-emitting structure.

13. The semiconductor structure of claim 7, wherein the distance is about five nanometers (5 nm) or less.

14. The semiconductor structure of claim 13, wherein the distance is about one nanometer (1 nm) or less.

15. The semiconductor structure of claim 14, wherein the distance is about one-half of a nanometer (0.5 nm) or less.

16. The semiconductor structure of claim 7, wherein a percentage concentration of zinc in the at least one bonding layer decreases proximate to the bonding interface.

17. The semiconductor structure of claim 7, wherein each of the first element and the second element comprises a III-V semiconductor material.

18. The semiconductor structure of claim 7, wherein the at least one bonding layer comprises a first bonding layer disposed on the first element and a second bonding layer disposed on the second element, the bonding interface disposed between the first bonding layer and the second bonding layer, and wherein each of the first bonding layer and the second bonding layer is at least substantially comprised of zinc, silicon and oxygen, and wherein a percentage concentration of silicon in each of the first bonding layer and the second bonding layer increases proximate to the bonding interface and a percentage concentration of zinc in each of the first bonding layer and the second bonding layer decreases proximate to the bonding interface.

19. A semiconductor structure, comprising:
  a first element and a second element, each of the first element and the second element comprising crystalline semiconductor material, and
  at least one bonding layer disposed between and physically, optically, and electrically coupling the first element and the second element, the at least one bonding layer formed by molecularly bonding the first element with the second element, and being electrically conductive and transparent to light, and at least substantially comprising zinc, silicon, and oxygen, a percentage concentration of silicon in the at least one bonding layer increasing proximate to a bonding interface between the at least one bonding layer and at least one of the first element and the second element such that a composition of the at least one bonding layer is at least substantially comprised of silicon oxide within a distance adjacent to the bonding interface, the distance being sufficiently small to at least substantially preserve electrical conductivity of the at least one bonding layer through the silicon oxide.

* * * * *